(12) United States Patent
Matsuzawa

(10) Patent No.: US 10,886,188 B2
(45) Date of Patent: Jan. 5, 2021

(54) ELECTRONIC COMPONENT-INCORPORATING SUBSTRATE

(71) Applicant: SHINKO ELECTRIC INDUSTRIES CO., LTD., Nagano (JP)

(72) Inventor: Satoshi Matsuzawa, Nagano (JP)

(73) Assignee: SHINKO ELECTRIC INDUSTRIES CO., LTD.

( * ) Notice: Subject to any disclaimer, the term of this patent is extended or adjusted under 35 U.S.C. 154(b) by 0 days.

(21) Appl. No.: 16/576,030

(22) Filed: Sep. 19, 2019

(65) Prior Publication Data

US 2020/0098656 A1  Mar. 26, 2020

(30) Foreign Application Priority Data

Sep. 25, 2018  (JP) ................. 2018-178529

(51) Int. Cl.
*H01L 23/31* (2006.01)
*H01L 23/538* (2006.01)
*H01L 23/00* (2006.01)

(52) U.S. Cl.
CPC ...... *H01L 23/3121* (2013.01); *H01L 23/3135* (2013.01); *H01L 23/5383* (2013.01); *H01L 23/5389* (2013.01); *H01L 23/562* (2013.01); *H01L 24/16* (2013.01); *H01L 24/48* (2013.01); *H01L 24/73* (2013.01); *H01L 2224/16227* (2013.01); *H01L 2224/48091* (2013.01); *H01L 2224/48229* (2013.01); *H01L 2224/73207* (2013.01)

(58) Field of Classification Search
CPC ....................................................... H01L 24/48
See application file for complete search history.

(56) References Cited

FOREIGN PATENT DOCUMENTS

JP  2008153536 A  7/2008

*Primary Examiner* — Matthew L Reames
(74) *Attorney, Agent, or Firm* — Tarolli, Sundheim, Covell & Tummino LLP

(57) ABSTRACT

An electronic component-incorporating substrate includes a lower substrate, an upper substrate, an electronic component located between the upper and lower substrates, a metal post connecting a first connection pad of the electronic component to a mounting pad of the lower substrate, a bonding wire connecting a second connection pad of the electronic component to a connection pad of the upper substrate, and an underfill resin filling the space between the electronic component and the lower substrate. The underfill resin covers the metal post and a first end of the bonding wire connected to the second connection pad of the electronic component. The bonding wire further includes a loop located at a lower position than a lower end of the metal post. The lower substrate further includes an accommodation portion that accommodates the loop.

12 Claims, 14 Drawing Sheets

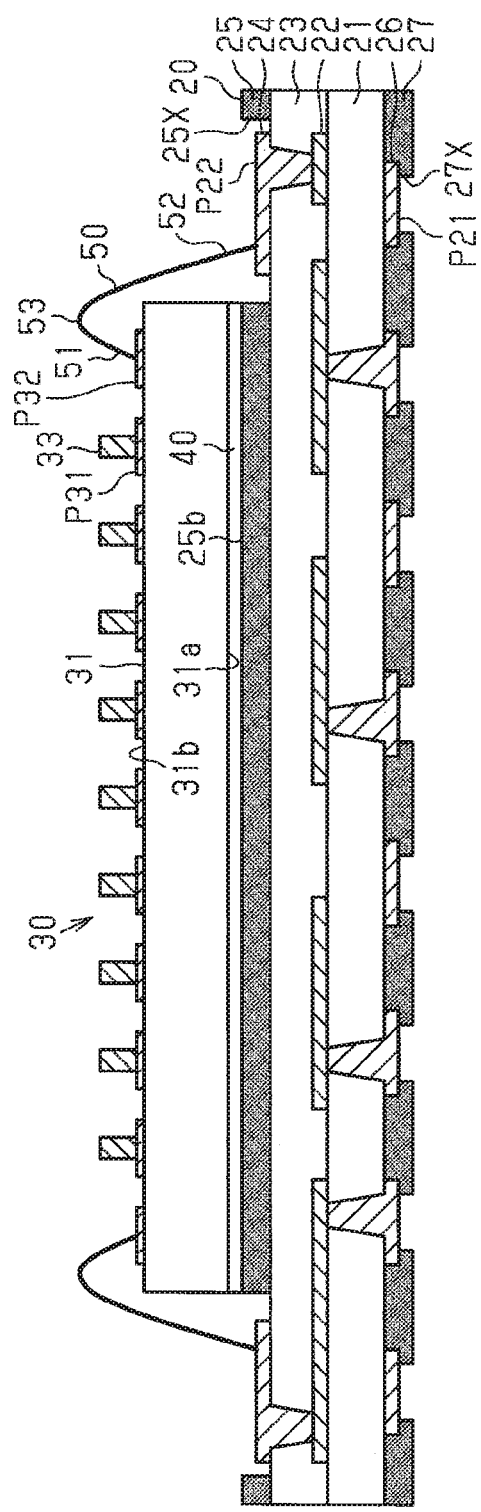
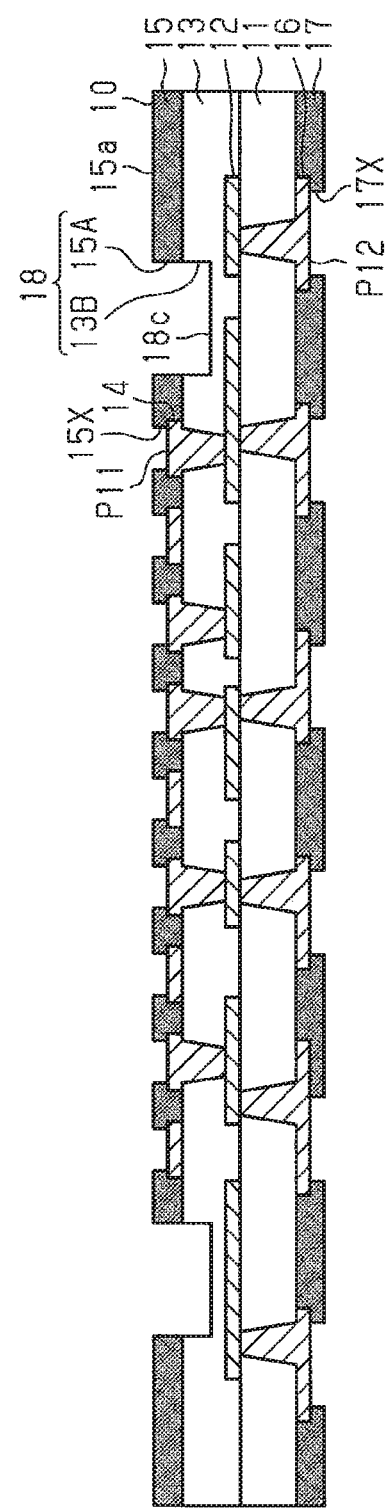
Fig.5A
Fig.5B

10,886,188 B2

ELECTRONIC COMPONENT-INCORPORATING SUBSTRATE

CROSS-REFERENCE TO RELATED APPLICATIONS

This application is based upon and claims the benefit of priority from prior Japanese Patent Application No. 2018-178529, filed on Sep. 25, 2018, the entire contents of which are incorporated herein by reference.

FIELD

This disclosure relates to an electronic component-incorporating substrate.

BACKGROUND

An electronic component-incorporating substrate that has an embedded electronic component has been developed so that a substrate including electronic components such as a semiconductor chip may be reduced in size to occupy less space. In a typical electronic component-incorporating substrate, an electronic component is connected by bumps to a lower wiring substrate and connected by solder balls to an upper wiring substrate. Japanese Laid-Open Patent Publication No. 2008-153536 describes one example of an electronic component-incorporating substrate.

The integration and sophistication of semiconductor elements or chips has resulted in a demand for finer wiring in wiring substrates including semiconductor elements. However, when solder balls are used for the connection of electronic components like an electronic component-incorporating substrate, it will be difficult to reduce the thickness of the electronic component-incorporating substrate and mount highly integrated and highly sophisticated electronic components.

SUMMARY

One embodiment of an electronic component-incorporating substrate includes a lower substrate, an upper substrate, an electronic component, a metal post, a bonding wire, and an underfill resin. The lower substrate includes a mounting pad in an upper surface of the lower substrate. The upper substrate includes a connection pad in a lower surface of the upper substrate. The electronic component is located between the lower substrate and the upper substrate and includes a first connection pad and a second connection pad on a lower surface of the electronic component. The metal post connects the first connection pad to the mounting pad of the lower substrate. The bonding wire includes a first end connected to the second connection pad and a second end connected to the connection pad of the upper substrate. The underfill resin fills a space between the electronic component and the lower substrate and covers the metal post and the first end of the bonding wire. The bonding wire further includes a loop located at a lower position than a lower end of the metal post. The lower substrate further includes an accommodation portion that accommodates the loop of the bonding wire.

Other embodiments and advantages thereof will become apparent from the following description, taken in conjunction with the accompanying drawings, illustrating by way of example the principles of the invention. It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 4A, 4B, 5A, 5B, and 6 to 9 are schematic cross-sectional views illustrating manufacturing steps of the electronic component-incorporating substrate of FIG. 1;

DESCRIPTION OF THE EMBODIMENTS

Figure 1:
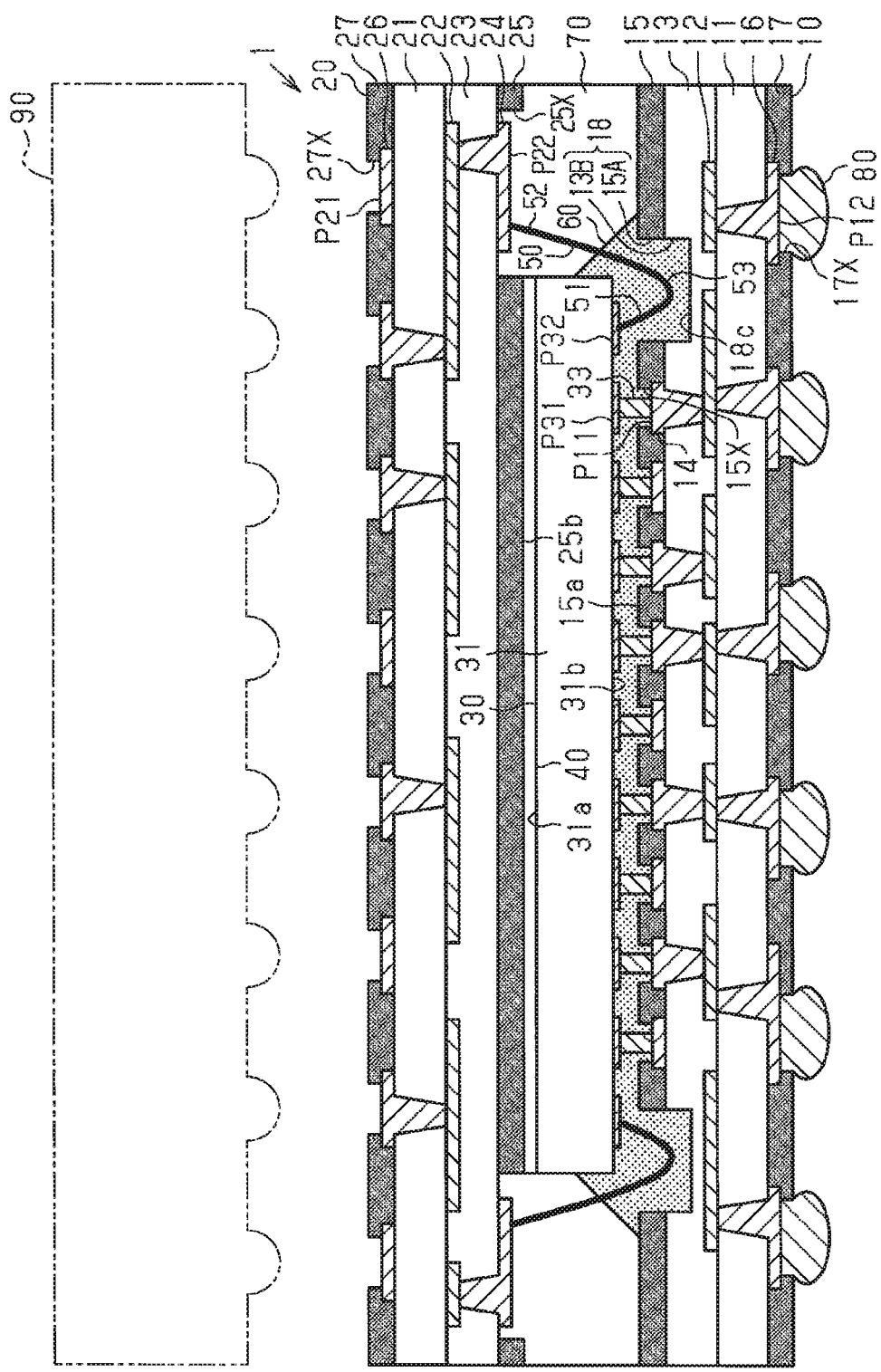
FIG. 1 is a schematic cross-sectional view of an electronic component-incorporating substrate in accordance with one embodiment.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings. In this specification, a plan view refers to a view of a subject taken in a vertical direction (e.g., upper-lower direction as viewed in FIG. 1), and a planar shape refers to a shape of a subject as viewed in the vertical direction.

As illustrated in FIG. 1, an electronic component-incorporating substrate 1 includes a lower substrate 10, an upper substrate 20, a semiconductor element 30 (semiconductor chip), bonding wires 50, an underfill resin 60, and an encapsulation resin 70. The semiconductor element 30 is one example of an electronic component.

The lower substrate 10 has an upper surface (upper side as viewed in FIG. 1) including mounting pads P11 and a lower surface (lower side as viewed in FIG. 1) including external connection pads P12. The mounting pads P11 are used to mount, for example, the semiconductor element 30 on the lower substrate 10. The external connection pads P12 are used to mount the electronic component-incorporating substrate 1 on another substrate, for example, a mounting substrate such as a motherboard.

The lower substrate 10 will now be described. FIG. 1 illustrates one example of the lower substrate 10. The configuration of the lower substrate 10 may be changed in any manner. The lower substrate 10 includes an insulation layer 11, a wiring layer 12, an insulation layer 13, a wiring layer 14, a solder resist layer 15, a wiring layer 16, and a solder resist layer 17.

The insulation layer 11 may be, for example, a glass epoxy substrate obtained by impregnating a glass cloth with epoxy resin. The insulation layer 11 may be a substrate formed by impregnating a woven cloth or non-woven cloth of glass fibers, carbon fibers, aramid fibers, or the like with an insulative resin such as an epoxy resin. The insulation layer 11 may include a filler of silica (silicon dioxide) or the like. In the present example, a glass epoxy substrate is used as the insulation layer 11. However, the glass cloth is not illustrated in the drawings.

The wiring layer 12 is formed on the upper surface of the insulation layer 11. The material of the wiring layer 12 may be, for example, copper (Cu), a copper alloy, or the like.

The insulation layer 13 covers the wiring layer 12 formed on the upper surface of the insulation layer 11. The material of the insulation layer 13 may be, for example, an insulative resin such as a thermosetting epoxy resin. The insulation layer 13 may include a filler of silica (silicon dioxide) or the like.

The wiring layer 14 is formed on the upper surface of the insulation layer 13. The wiring layer 14 includes via wirings, which extend through the insulation layer 13 in the thickness-wise direction, and wiring patterns, which are formed on the upper surface of the insulation layer 13 and connected by the via wirings of the wiring layer 14 to the wiring layer 12. The material of the wiring layer 14 may be, for example, copper, a copper alloy, or the like.

The solder resist layer 15, which is formed on the upper surface of the insulation layer 13, covers parts of the wiring layer 14 and the upper surface of the insulation layer 13. The solder resist layer 15 includes openings 15X that expose parts of the upper surface of the wiring layer 14 as the mounting pads P11. The material of the solder resist layer 15 may be, for example, an insulative resin such as an epoxy resin or an acrylic resin.

When necessary, a surface-processed layer may be formed on the upper surface of the wiring layer 14 exposed from the openings 15X. Examples of the surface-processed layer include a gold (Au) layer, a nickel (Ni) layer/Au layer (metal layer in which Ni layer is bottom layer and Au layer is formed on Ni layer), and a Ni layer/palladium (Pd) layer/Au layer (metal layer in which Ni layer is bottom layer and Ni layer, Pd layer, and Au layer are stacked in this order). The Au layer, the Ni layer, and the Pd layer may each be, for example, an electroless plating metal layer formed through an electrolytic plating process. The Au layer is a metal layer of Au or an Au alloy. The Ni layer is a metal layer of Ni or a Ni alloy. The Pd layer is a metal layer of Pd or a Pd alloy. The upper surface of the wiring layer 14 may undergo an anti-oxidation process such as an organic solderability preservative (OSP) process to form a surface-processed surface. When performing the OSP process, a surface-processed surface formed by, for example, an organic coating of an azole alloy, an imidazole alloy, or the like is formed on the upper surface of the wiring layer 14 (mounting pads P11). The surface-processed layer formed in this manner on the upper surface of the wiring layer 14 exposed in the openings 15X may be used as the mounting pads P11.

The wiring layer 16 is formed on the lower surface of the insulation layer 11. The wiring layer 16 includes via wirings, which extend through the insulation layer 11 in the thickness-wise direction, and wiring patterns, which are formed on the lower surface of the insulation layer 11 and connected by the via wirings of the wiring layer 16 to the wiring layer 12. The material of the wiring layer 16 may be, for example, copper, a copper alloy, or the like.

The solder resist layer 17, which is formed on the lower surface of the insulation layer 11, covers parts of the wiring layer 16 and the lower surface of the insulation layer 11. The solder resist layer 17 includes openings 17X that expose parts of the lower surface of the wiring layer 16 as the external connection pads P12. The material of the solder resist layer 17 may be, for example, an insulative resin such as an epoxy resin or an acrylic resin.

When necessary, a surface-processed layer may be formed on the lower surface of the wiring layer 16 exposed from the openings 17X. Examples of the surface-processed layer include a Au layer, a Ni layer/Au layer, and a Ni layer/Pd layer/Au layer. The Au layer, the Ni layer, and the Pd layer may each be, for example, an electroless plating metal layer formed through an electrolytic plating process. The Au layer is a metal layer of Au or an Au alloy. The Ni layer is a metal layer of Ni or a Ni alloy. The Pd layer is a metal layer of Pd or a Pd alloy. The lower surface of the wiring layer 14 may undergo an anti-oxidation process such as an OSP process to form a surface-processed surface. When performing the OSP process, a surface-processed surface formed by, for example, an organic coating of an azole alloy, an imidazole alloy, or the like is formed on the lower surface of the wiring layer 16 (external connection pads P12). The surface-processed layer formed in this manner on the lower surface of the wiring layer 16 exposed in the openings 17X may be used as the external connection pads P12.

Figure 3:
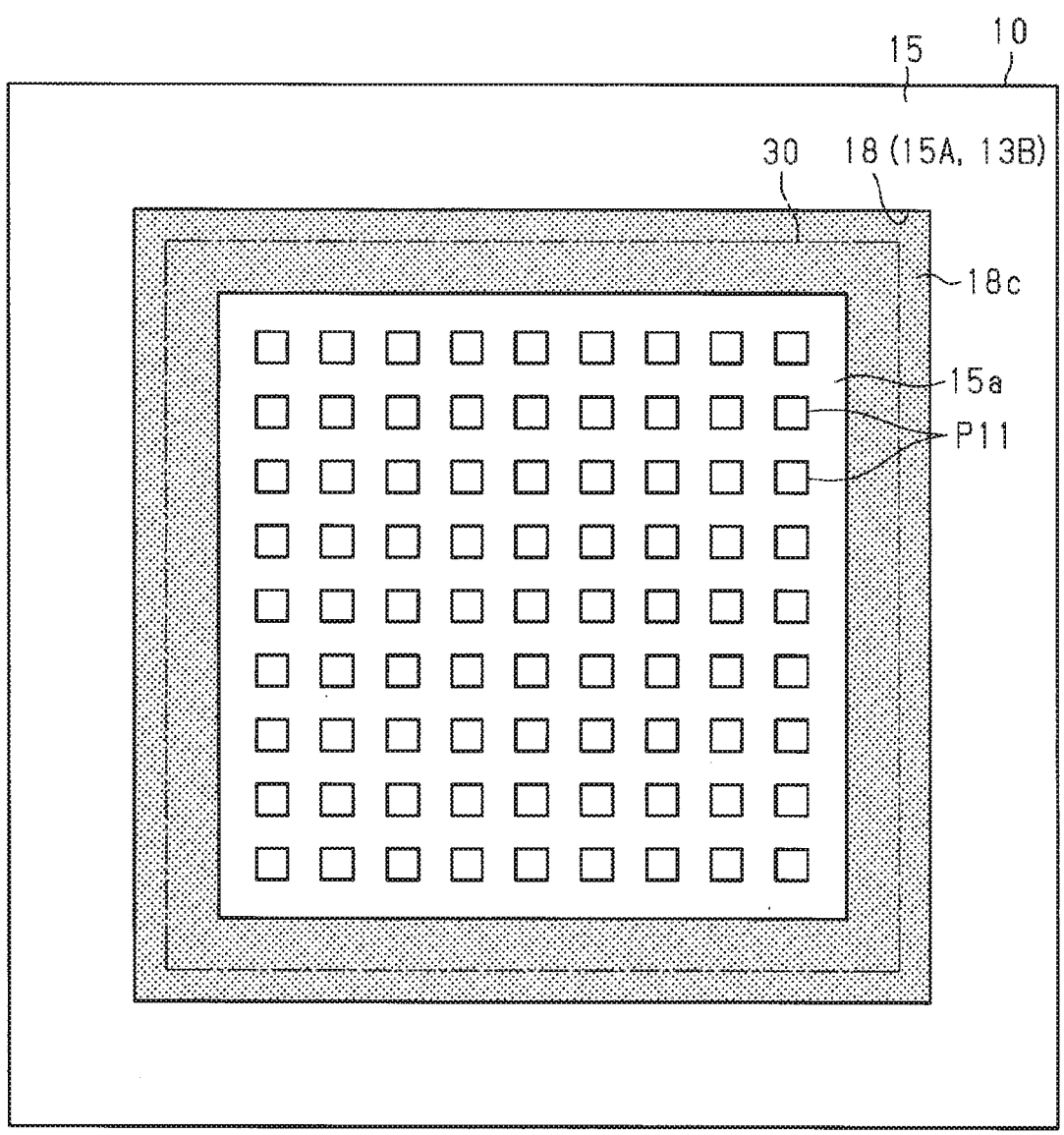
FIG. 3 is a schematic plan view illustrating a lower substrate of the electronic component-incorporating substrate of FIG. 1.

The lower substrate 10 further includes an accommodation portion 18. The accommodation portion 18 accommodates part of each bonding wire 50. The accommodation portion 18 includes a bottom surface 18c. The bottom surface 18c is located at a lower position than an upper surface 15a of the solder resist layer 15 that is the upper surface of the lower substrate 10. In the present embodiment, the bottom surface 18c of the accommodation portion 18 is located inside the insulation layer 13 of the lower substrate 10. In the example illustrated in FIG. 1, the solder resist layer 15 includes an opening 15A (through hole), and the insulation layer 13 includes a recess 13B. The recess 13B of the insulation layer 13 and the opening 15A of the solder resist layer 15 form the accommodation portion 18. In this manner, the accommodation portion 18 is recessed downward from the upper surface 15a of the uppermost insulation layer (i.e., solder resist layer 15) over two insulation layers (i.e., solder resist layer 15 and insulation layer 13). As illustrated in FIG. 3, the accommodation portion 18 is a groove extending along the periphery (i.e., four sides) of the semiconductor element 30, which is rectangular in a plan view. In the present example, the accommodation portion 18 is a frame-shaped groove extending along the periphery of the semiconductor element 30. In the plan view of FIG. 3, the bottom surface 18c of the accommodation portion 18 is shaded to indicate the location of the accommodation portion 18.

Figure 2:
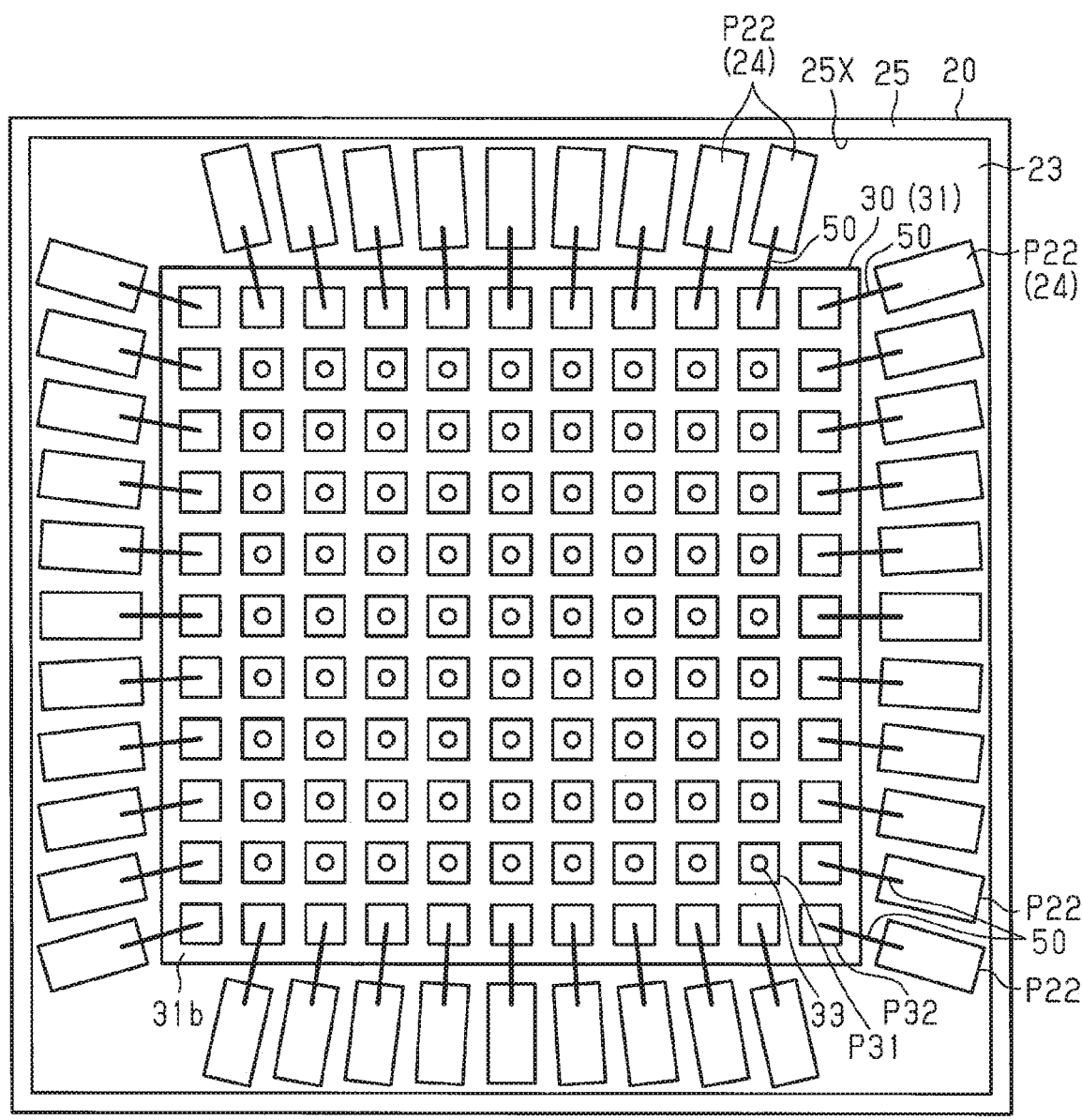
FIG. 2 is a schematic plan view illustrating an electronic component and an upper substrate of the electronic component-incorporating substrate of FIG. 1.

The semiconductor element 30 is mounted on the lower substrate 10. The semiconductor element 30 is flip-chip mounted on the lower substrate 10 in a state in which a circuit formation surface 31b (lower surface of semiconductor element 30 as viewed in FIG. 1) is faced toward the upper surface of the lower substrate 10. The semiconductor element 30 includes an element body 31, first connection pads P31, and second connection pads P32. The semiconductor element 30 is connected by connection terminals to the lower substrate 10. In the present example, the connection terminals are metal posts 33. As illustrated in FIG. 1, the first connection pads P31 and the second connection pads P32 are laid out on the circuit formation surface 31b of the element body 31. As illustrated in FIG. 2, the element body 31 is rectangular (e.g., square) in a plan view, and the first connection pads P31 are laid out in a grid arrangement on the circuit formation surface 31b of the element body 31 (lower surface of semiconductor element 30 as viewed in FIG. 1). The metal posts 33 are connected to the first connection pads P31.

The metal post 33 are rod-shaped (e.g., cylindrical) and connected by, for example, solder (not illustrated) to the first connection pads P31. The material of the metal posts 33 is, for example, copper, a copper alloy, or the like. As illustrated in FIG. 2, the second connection pads P32 are laid out on the circuit formation surface 31b of the element body 31 (lower surface of semiconductor element 30 as viewed in FIG. 1) along the periphery (e.g., four sides) of the element body 31. As illustrated in FIG. 1, the accommodation portion 18 of the lower substrate 10 is located in a region overlapped with the second connection pads P32 of the semiconductor element 30 in a plan view. That is, the accommodation portion 18 is overlapped with the periphery (i.e., four sides) of the semiconductor element 30. The second connection pads P32 are connected by a wiring pattern (not illustrated) of the element body 31 to the first connection pads P31. In the example of FIG. 2, the second connection pads P32 are laid out along each of the four sides of the element body 31 but may be laid out along at least one side.

The semiconductor element 30 may be, for example, a logic chip such as a central processing unit (CPU) chip or a graphics processing unit (GPU) chip. Further, the semiconductor element 30 may be, for example, a memory chip such as a dynamic random access memory (DRAM) chip, a static random access memory (SRAM) chip, or a flash memory chip. Multiple semiconductor elements 30 including a combination of a logic chip and a memory chip may be incorporated in the electronic component-incorporating substrate 1. Additionally, the electronic component incorporated in the electronic component-incorporating substrate 1 is not limited to the semiconductor element 30. A chip size package (CSP) of a semiconductor element including rewiring may be incorporated as the electronic component in the electronic component-incorporating substrate 1.

The upper substrate 20 has an upper surface (upper side as viewed in FIG. 1) including external connection pads P21 and a lower surface (lower side as viewed in FIG. 1) including connection pads P22. The external connection pads P21 are used to mount, for example, a semiconductor package 90 on the electronic component-incorporating substrate 1. The connection pads P22 are used to connect, for example, the semiconductor element 30 to the upper substrate 20.

The upper substrate 20 includes an insulation layer 21, a wiring layer 22, an insulation layer 23, a wiring layer 24, a solder resist layer 25, a wiring layer 26, and a solder resist layer 27.

The insulation layer 21 may be, for example, a glass epoxy substrate obtained by impregnating a glass cloth with epoxy resin. The insulation layer 21 may be a substrate formed by impregnating a woven cloth or non-woven cloth of glass fibers, carbon fibers, aramid fibers, or the like with an insulative resin such as an epoxy resin. In the present example, a glass epoxy substrate is used as the insulation layer 21. However, the glass cloth is not illustrated in the drawings.

The wiring layer 22 is formed on the lower surface of the insulation layer 21. The material of the wiring layer 22 may be, for example, copper (Cu), a copper alloy, or the like.

The insulation layer 23 covers the wiring layer 22 formed on the lower surface of the insulation layer 21. The material of the insulation layer 23 may be, for example, an insulative resin such as a thermosetting resin. The insulation layer 23 may include a filler of silica or the like.

The wiring layer 24 is formed on the lower surface of the insulation layer 23. The wiring layer 24 includes via wirings, which extend through the insulation layer 23 in the thickness-wise direction, and wiring patterns, which are formed on the lower surface of the insulation layer 23 and connected by the via wirings of the wiring layer 24 to the wiring layer 24. The wiring patterns of the wiring layer 24 are patterned as the connection pads P22. In the present example, as illustrated in FIG. 2, the connection pads P22 are laid out along the periphery (i.e., four sides) of the upper substrate 20. The material of the wiring layer 24 may be, for example, copper, a copper alloy, or the like.

The solder resist layer 25 is formed on the lower surface of the insulation layer 23. The solder resist layer 25 includes an opening 25X exposing the connection pads P22 of the wiring layer 24. In the present example, as illustrated in FIGS. 1 and 2, the opening 25X is frame-shaped in a plan view and extends along the periphery of the upper substrate 20. The material of the solder resist layer 25 may be, for example, an insulative resin such as an epoxy resin or an acrylic resin. When necessary, a surface-processed layer may be formed on the lower surface of the wiring layer 24 (connection pads P22) exposed from the opening 25X. Examples of the surface-processed layer are the same as the surface-processed layer formed on the upper surface of the wiring layer 14 (mounting pads P11) exposed from the openings 15X in the solder resist layer 15 of the lower substrate 10.

The wiring layer 26 is formed on the upper surface of the insulation layer 21. The wiring layer 26 includes via wirings, which extend through the insulation layer 21 in the thickness-wise direction, and wiring patterns, which are formed on the upper surface of the insulation layer 21 and connected by the via wirings of the wiring layer 26 to the wiring layer 22. The material of the wiring layer 26 may be, for example, copper, a copper alloy, or the like.

The solder resist layer 27, which is formed on the upper surface of the insulation layer 21, covers parts of the wiring layer 26 and the upper surface of the insulation layer 21. The solder resist layer 27 includes openings 27X that expose parts of the upper surface of the wiring layer 26 as the external connection pads P21. The material of the solder resist layer 27 may be, for example, an insulative resin such as an epoxy resin or an acrylic resin. When necessary, a surface-processed layer may be formed on the upper surface of the wiring layer 26 exposed from the openings 27X. Examples of the surface-processed layer are the same as the surface-processed layer formed on the lower surface of the wiring layer 16 exposed from the openings 17X in the solder resist layer 17 of the lower substrate 10.

The semiconductor element 30 is adhered to the upper substrate 20. In the present example, a back surface 31a (upper surface as viewed in FIG. 1) of the element body 31, which is located at a side opposite to the circuit formation surface 31b of the element body 31 (lower surface as viewed in FIG. 1), is adhered by an adhesive 40 to a lower surface 25b of the solder resist layer 25 of the upper substrate 20. A liquid or sheet of an epoxy resin or the like may be used as the adhesive 40.

As illustrated in FIGS. 1 and 2, the second connection pads P32 of the semiconductor element 30 are connected by the bonding wires 50 to the connection pads P22 of the upper substrate 20. The material of the bonding wires 50 may be, for example, gold, copper, aluminum (Al), or the like.

Each bonding wire 50 includes a first end 51 connected to a corresponding one of the second connection pads P32 of the semiconductor element 30, a second end 52 connected to a corresponding one of the connection pads P22 of the upper substrate 20, and a loop 53. The loop 53 may be arched. The loop 53 is located at a lower position than the upper surface of the lower substrate 10 (upper surface 15a of solder resist layer 15). In the example illustrated in FIG. 1, the loop 53 is located at a lower position than the lower ends of the metal posts 33 (i.e., upper surface of mounting pads P11). The loop 53 has a loop peak defining a lowermost portion in a height-wise direction (stacking direction of lower substrate 10 and upper substrate 20). For example, the lowermost portion (loop peak) is located at a lower position than the upper surface of the lower substrate 10. In the example illustrated in FIG. 1, the lowermost portion is located at a lower position than the lower ends of the metal posts 33. The loop 53 of each bonding wire 50 is accommodated in the accommodation portion 18 of the lower substrate 10.

The gap between the semiconductor element 30 and the lower substrate 10 is filled with the underfill resin 60. The underfill resin 60 covers the circuit formation surface 31b (lower surface as viewed in FIG. 1) of the element body 31, the metal posts 33, and the first ends 51 of the bonding wires 50. In the example illustrated in FIG. 1, the underfill resin 60 further covers the first connection pads P31 and the second connection pads P32. The underfill resin 60 also extends to the side surfaces of the semiconductor element 30 (side surfaces of element body 31). The accommodation portion 18 is also filled with the underfill resin 60 covering the loops 53 of the bonding wires 50 accommodated in the accommodation portion 18.

The material of the underfill resin 60 may be, for example, an insulative resin such as an epoxy resin. Further, the material of the underfill resin 60 may be, for example, a resin material obtained by mixing a filler of silica or the like with an epoxy resin or a polyimide resin. The filler is not limited to filler and may be any other suitable inorganic or organic compound, for example, titanium oxide, aluminum oxide, aluminum nitride, silicon carbide, calcium titanate, zeolite, or the like.

Preferably, the material of the underfill resin 60 is a resin material having high fluidity. The high fluidity allows the gaps between the metal posts 33, the gaps between the bonding wires 50, and the accommodation portion 18 to be filled with the underfill resin 60. Further, the high fluidity limits deformation of the bonding wires 50.

The gap between the lower substrate 10 and the upper substrate 20 is filled with the encapsulation resin 70. The encapsulation resin 70 covers the upper surface of the lower substrate 10 (upper surface 15a of solder resist layer 15) and the lower surface of the upper substrate 20 (lower surface 25b of the solder resist layer 25) so that the encapsulation resin 70 encapsulates the semiconductor element 30, parts of the bonding wires 50 (second ends 52) exposed from the underfill resin 60, the underfill resin 60, and the connection pads P22. The encapsulation resin 70 functions as a protective layer that protects the semiconductor element 30 and the bonding wires 50 (second ends 52). The encapsulation resin 70 increases the mechanical strength of the entire electronic component-incorporating substrate 1.

The material of the encapsulation resin 70 may be, for example, an insulative resin such as an epoxy resin or a polyimide resin. Further, the material of the encapsulation resin 70 may be, for example, a resin material obtained by mixing a filler of silica or the like with an epoxy resin or a polyimide resin. The filler is not limited to filler and may be any other suitable inorganic or organic compound, for example, titanium oxide, aluminum oxide, aluminum nitride, silicon carbide, calcium titanate, zeolite, or the like.

The material of the encapsulation resin 70 may be a material having a lower fluidity than the underfill resin 60. The fluidity may be adjusted by, for example, the size or amount of the filler added to the resin. For example, the filler included in the underfill resin 60 is smaller in size than the filler included in the encapsulation resin 70. The encapsulation resin 70 and the underfill resin 60 need only differ from each other in fluidity. Thus, at least one of the encapsulation resin 70 and the underfill resin 60 may be formed from a material that does not include a filler.

As illustrated in FIG. 1, external connection terminals 80 are formed on the lower surfaces of the external connection pads P12. The external connection terminals 80 are, for example, bumps and used to mount the electronic component-incorporating substrate 1 on another substrate (e.g., mounting substrate such as motherboard). The external connection terminals may be solder balls, lead pins, stud bumps, or the like.

The semiconductor package 90 may be mounted on the electronic component-incorporating substrate 1. The semiconductor package 90 includes, for example, a semiconductor memory and is connected to the external connection pads P21 of the electronic component-incorporating substrate 1. The semiconductor package 90 is electrically connected via the upper substrate 20, the bonding wires 50, the semiconductor element 30, and the metal posts 33 to the lower substrate 10. The external connection pads P21 may be used to connect the electronic component-incorporating substrate 1 to another substrate in the same manner as the external connection pads P12.

A method for manufacturing the electronic component-incorporating substrate 1 will now be described with reference to FIGS. 4A to 9.

Figure 4A:
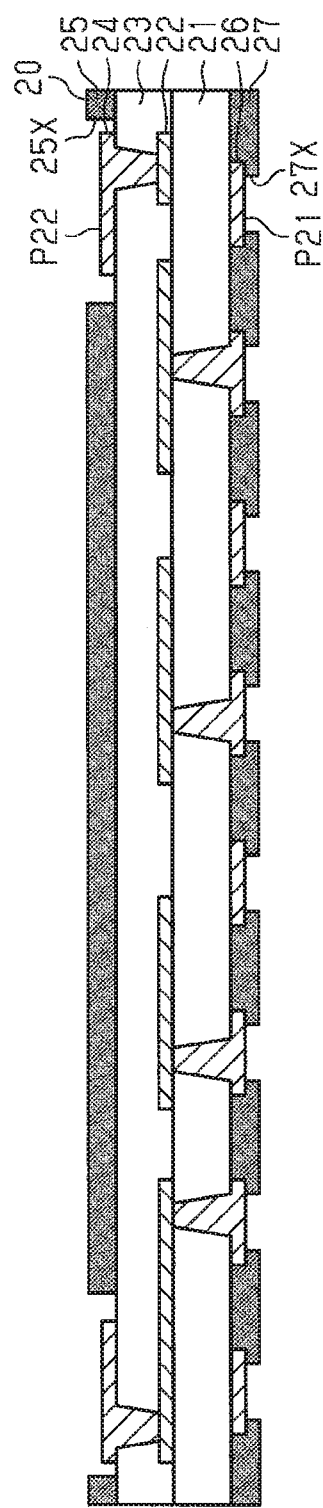

In the step illustrated in FIG. 4A, the upper substrate 20 is formed. In FIG. 4A, the upper substrate 20 illustrated in FIG. 1 is reversed upside-down.

First, the insulation layer 21 is prepared, and the wiring layer 22 is formed on the upper surface of the insulation layer 21. The wiring layer 22 may be formed through, for example, any of various types of wiring formation processes such as a subtractive process.

Then, the insulation layer 23 is formed on the upper surface of the insulation layer 21 to cover the wiring layer 22. The insulation layer 23 may be formed by, for example, laminating insulative resin films of a thermosetting epoxy resin or the like. A liquid or paste of an epoxy resin or the like may be used to form the insulation layer 23.

Via holes are formed in the insulation layer 21 to expose parts of the lower surface of the wiring layer 22. In the same manner, via holes are formed in the insulation layer 23 to expose parts of the upper surface of the wiring layer 22. Subsequent to the formation of the via holes, a desmearing process is performed when necessary. The desmearing process removes resin residues from the wiring layer 22 exposed at the bottom of each via hole. The via hole may be formed through, for example, a laser drilling or the like.

Then, the wiring layer 24 is formed on the upper surface of the insulation layer 23, and the wiring layer 26 is formed on the lower surface of the insulation layer 21. The wiring layer 24 is patterned into the form of wiring patterns that include the connection pads P22 (refer to FIG. 2). The wiring layers 24 and 26 may be formed through, for example, any of various types of wiring formation processes such as a semi-additive process.

The insulation layers 21 and 23 and the wiring layers 22, 24, and 26 do not have to be formed in the order described above. For example, the wiring layer 26 may first be formed on the lower surface of the insulation layer 21, and then, for example, the wiring layer 22, the insulation layer 23, and the wiring layer 24 may be formed one after another.

Then, the solder resist layer 25, which includes the opening 25X exposing the connection pads P22 of the wiring layer 24, is formed on the upper surface of the insulation layer 23. Further, the solder resist layer 27, which includes the openings 27X exposing parts of the wiring layer 26 as the external connection pads P21, is formed on the lower surface of the insulation layer 21. The solder resist layer 25 may be formed by, for example, applying a liquid or paste of an insulative resin such as a photosensitive epoxy resin to the upper surface of the insulation layer 23 through a screen printing process, a roll coating process, or a spin coating process. In the same manner, the solder resist layer 27 may be formed by, for example, applying a liquid or paste of an insulative resin such as a photosensitive epoxy resin to the lower surface of the insulation layer 21, while covering the wiring layer 26, through a screen printing process, a roll coating process, or a spin coating process.

Figure 4B:
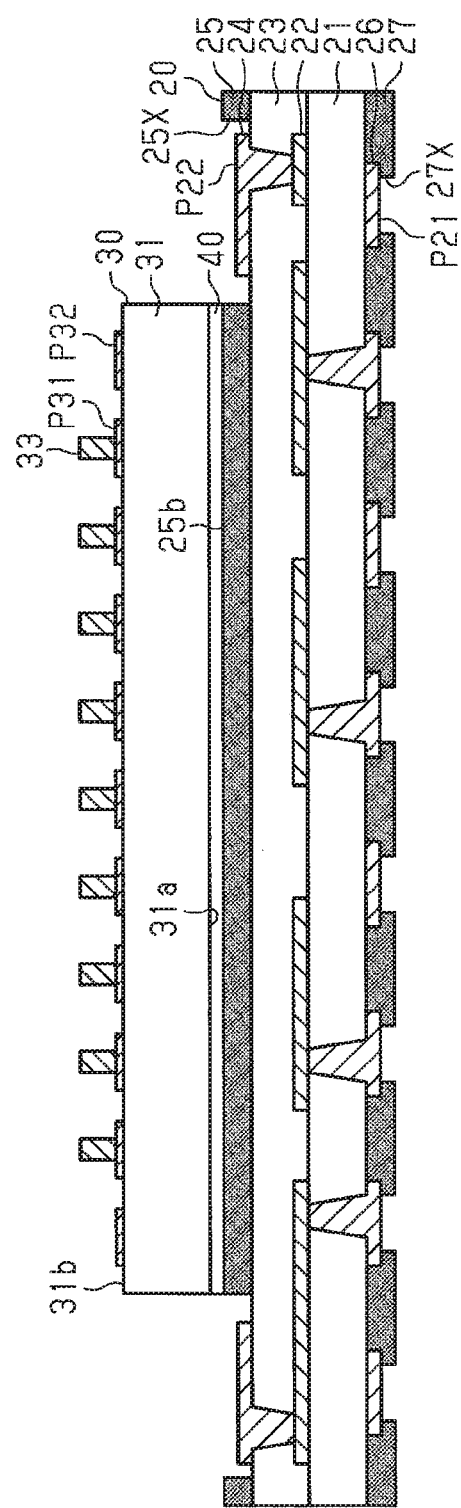

In the step illustrated in FIG. 4B, the semiconductor element 30 is mounted on the upper substrate 20. The semiconductor element 30 includes the first connection pads P31 and the second connection pads P32 on the circuit formation surface 31*b* (upper surface as viewed in FIG. 4B) of the element body 31. The metal posts 33 are formed on the first connection pads P31. The back surface 31*a* (lower surface as viewed in FIG. 4B) of the semiconductor element 30 is adhered by the adhesive 40 to the upper surface 25*b* of the solder resist layer 25 in a state in which the back surface 31*a* is opposed to the upper surface 25*b* of the solder resist layer 25 of the upper substrate 20 (i.e., lower surface 25*b* in FIG. 1), that is, in a face-up state in which the circuit formation surface 31*b* of the semiconductor element 30 is faced upward.

In the step illustrated in FIG. 5A, the bonding wires 50 connect the second connection pads P32 of the semiconductor element 30 and the connection pads P22 of the upper substrate 20. The bonding wires 50 are formed so that the loop peak of each bonding wire 50 is located at a higher position than the upper end of each metal post 33 (i.e., lower position than lower end of each metal post 33 in FIG. 1).

In the step illustrated in FIG. 5B, the lower substrate 10 is formed.

First, the insulation layer 11 is prepared, and the wiring layer 12 is formed on the upper surface of the insulation layer 11. The wiring layer 12 may be formed through, for example, any of various types of wiring formation processes such as a subtractive process.

Then, the insulation layer 13 is formed on the upper surface of the insulation layer 11 to cover the wiring layer 12. The insulation layer 13 may be formed by, for example, laminating insulative resin films of a thermosetting epoxy resin or the like. A liquid or paste of an epoxy resin or the like may be used to form the insulation layer 13.

Via holes are formed in the insulation layer 11 to expose parts of the lower surface of the wiring layer 12. In the same manner, via holes are formed in the insulation layer 13 to expose parts of the upper surface of the wiring layer 12. Subsequent to the formation of the via holes, a desmearing process is performed when necessary. The desmearing process removes resin residues from the wiring layer 12 exposed at the bottom of each via hole. The via hole may be formed through, for example, a laser drilling or the like.

Then, the wiring layer 14 is formed on the upper surface of the insulation layer 13, and the wiring layer 16 is formed on the lower surface of the insulation layer 11. The wiring layers 14 and 16 may be formed through, for example, any of various types of wiring formation processes such as a semi-additive process.

The insulation layers 11 and 13 and the wiring layers 12, 14, and 16 do not have to be formed in the order described above. For example, the wiring layer 16 may first be formed on the lower surface of the insulation layer 11. Then, for example, the wiring layer 12, the insulation layer 13, and the wiring layer 14 may be formed one after another.

Then, the solder resist layer 15, which includes the openings 15X exposing the mounting pads P11 of the wiring layer 14, is formed on the upper surface of the insulation layer 13. Further, the solder resist layer 17, which includes the openings 17X exposing parts of the wiring layer 16 as the external connection pads P12, is formed on the lower surface of the insulation layer 11. The solder resist layer 15 may be formed by, for example, applying a liquid or paste of an insulative resin such as a photosensitive epoxy resin to the upper surface of the insulation layer 13 through a screen printing process, a roll coating process, or a spin coating process. In the same manner, the solder resist layer 17 may be formed by, for example, applying a liquid or paste of an insulative resin such as a photosensitive epoxy resin to the lower surface of the insulation layer 11, while covering the wiring layer 16, through a screen printing process, a roll coating process, or a spin coating process.

Then, the accommodation portion 18 is formed. The accommodation portion 18 may be formed by, for example, machining the upper surface 15*a* of the solder resist layer 15 with a router or the like. In the present example, the formation of the accommodation portion 18 includes the formation of the opening 15A that extends through the solder resist layer 15 and the formation of the recess 13B that is connected to the opening 15A in the insulation layer 13.

Figure 6:
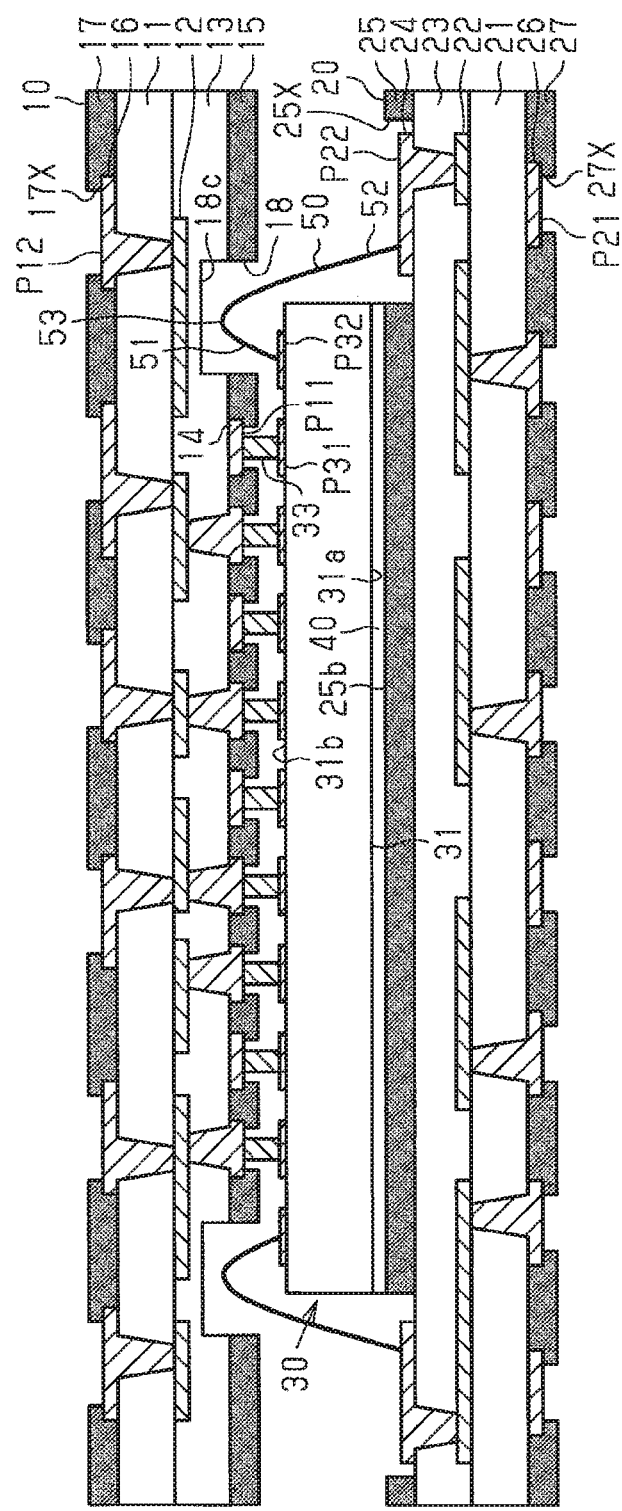

In the step illustrated in FIG. 6, the semiconductor element 30 is mounted on the lower substrate 10. In the present example, the mounting pads P11 of the lower substrate 10 are connected by solder (not illustrated) to the metal posts 33 of the semiconductor element 30. In this state, the loops 53 of the bonding wires 50 connected to the semiconductor element 30 are accommodated in the accommodation portion 18 of the lower substrate 10.

Figure 7:
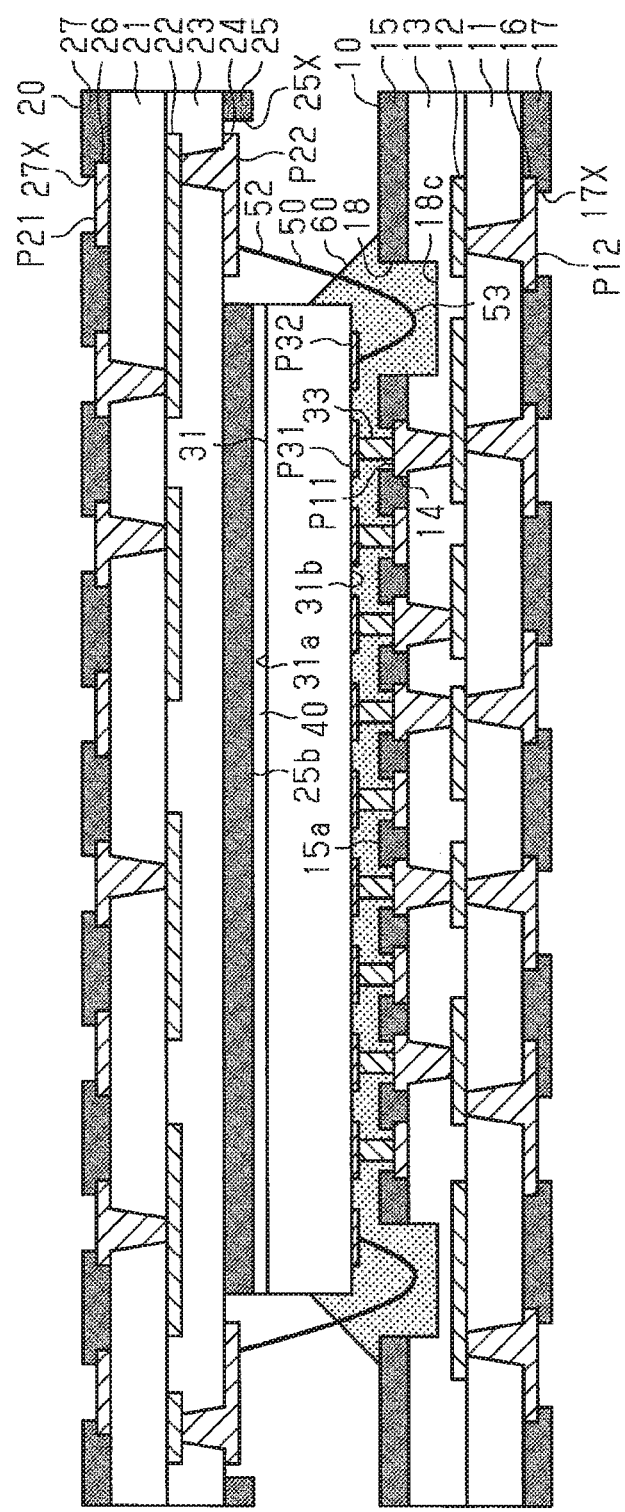

In the step illustrated in FIG. 7, the underfill resin 60 is formed between the semiconductor element 30 and the lower substrate 10. In the present example, the underfill resin 60 that is used has a relatively high fluidity. Accordingly, when filling the gap between the lower substrate 10 and the semiconductor element 30 with the underfill resin 60, the high fluidity of the underfill resin 60 fills the accommodation portion 18 with the underfill resin 60 in a suitable manner. As a result, the gap between the adjacent loops 53 accommodated in the accommodation portion 18 is also filled with the underfill resin 60 in a suitable manner.

Further, the high-fluidity underfill resin 60 limits deformation of the bonding wires 50 and prevents short-circuiting of the bonding wires 50.

The underfill resin 60 may be formed in advance on the lower substrate 10. In this case, the semiconductor element 30 may be pressed against the underfill resin 60 to connect the metal posts 33 of the semiconductor element 30 to the mounting pads P11 of the lower substrate 10. Further, deformation of the bonding wires 50 may be limited by adjusting the fluidity of the underfill resin 60.

Figure 8:
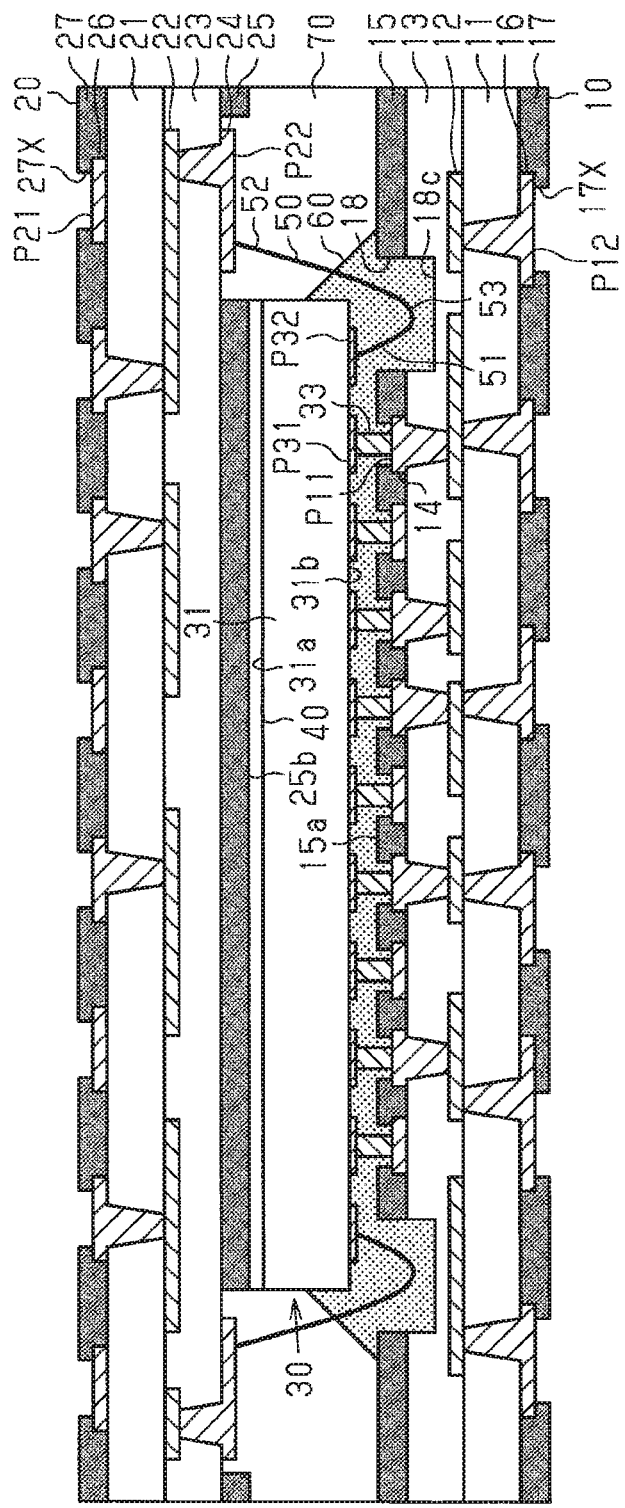

In the step illustrated in FIG. 8, the encapsulation resin 70 is formed. For example, the semiconductor element 30, the upper substrate 20, and the lower substrate 10 are arranged in an encapsulation mold, and the encapsulation mold is charged with resin to form the encapsulation resin 70. In this state, the underfill resin 60 covers the bonding wires 50 at the loops 53 in addition to where the first ends 51 are connected to the second connection pads P32. This limits deformation of the bonding wires 50 when charging the encapsulation mold with the encapsulation resin 70.

Figure 9:
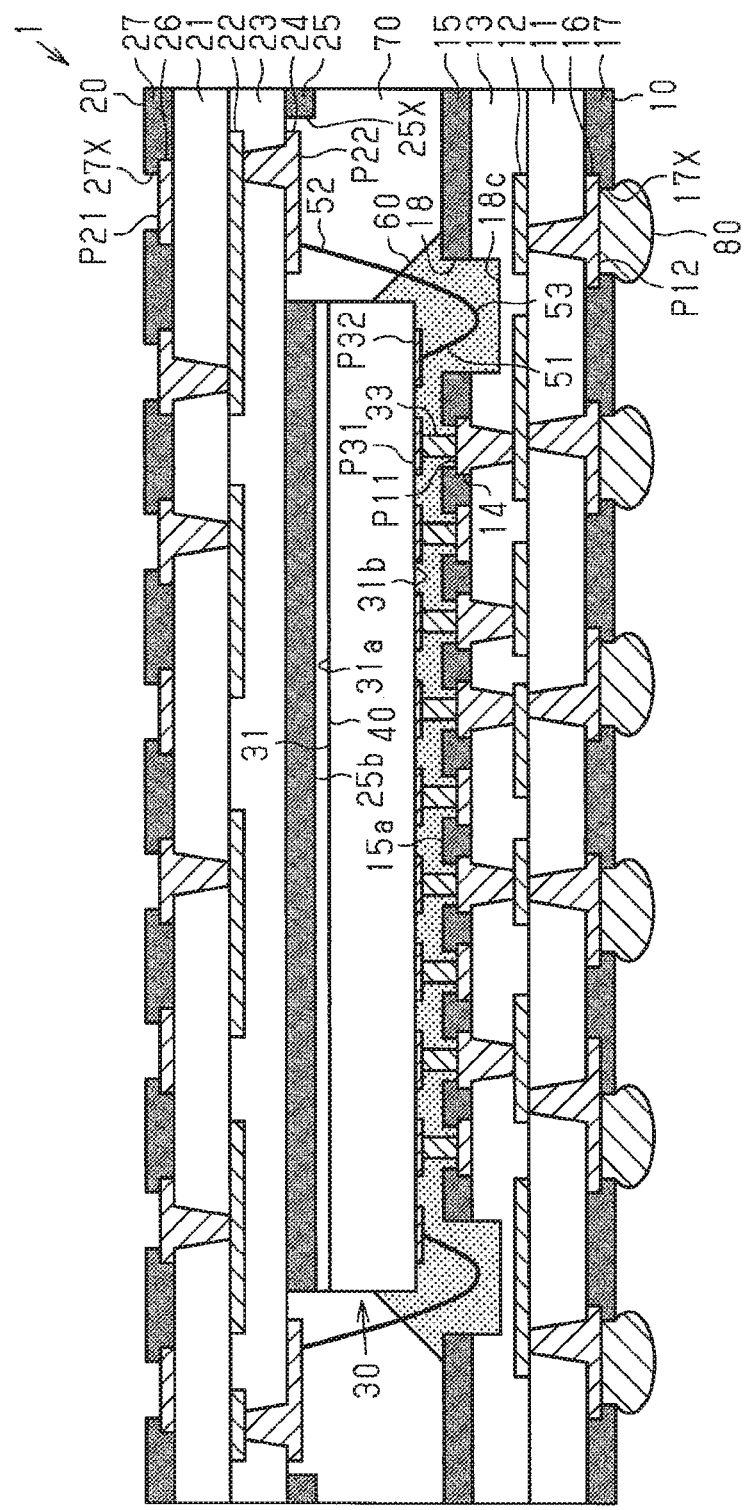

In the step illustrated in FIG. 9, the external connection terminals 80 are formed. For example, solder balls are mounted on the external connection pads P12 of the lower substrate 10. Then, a reflow process is performed on the solder balls to form the external connection terminals 80. The electronic component-incorporating substrate 1 illustrated in FIG. 1 is obtained through the manufacturing steps described above.

The above embodiment has the advantages described below.

(1) The electronic component-incorporating substrate 1 includes the lower substrate 10, the upper substrate 20, the semiconductor element 30 (semiconductor chip), the bonding wires 50, and the underfill resin 60. The lower substrate 10 includes the mounting pads P11 on the upper surface, and the upper substrate 20 includes the connection pads P22 on the lower surface. The semiconductor element 30 includes the element body 31, the first connection pads P31, and the second connection pads P32. Further, the semiconductor element 30 includes the wiring pattern (not illustrated) that connects the second connection pads P32 to the first connection pads P31. The electronic component-incorporating substrate 1 also includes the metal posts 33 that connect the first connection pads P31 of the semiconductor element 30 to the mounting pads P11 of the lower substrate 10. The second connection pads P32 are connected by the bonding wires 50 to the connection pads P22 of the upper substrate 20. The gap between the semiconductor element 30 and the lower substrate 10 is filled with the underfill resin 60 that covers the circuit formation surface 31b (lower surface as viewed in FIG. 1) of the element body 31, the first connection pads P31, the second connection pads P32, the metal posts 33, and the first ends 51 of the bonding wires 50. The lower substrate 10 further includes the accommodation portion 18 that accommodates the loops 53 of the bonding wires 50.

In the electronic component-incorporating substrate 1, the upper substrate 20 is connected by the bonding wires 50 and the semiconductor element 30 to the lower substrate 10. Thus, the distance between the lower substrate 10 and the upper substrate 20 may be decreased as long as space is available for the semiconductor element 30. This allows the electronic component-incorporating substrate 1 to be reduced in thickness.

(2) The electronic component-incorporating substrate 1 uses the metal posts 33 to connect the lower substrate 10 and the semiconductor element 30. The interval (pitch) of the first connection pads P31 on the semiconductor element 30 and the interval (pitch) of the mounting pads P11 on the lower substrate 10 may be set to be smaller when using the metal posts 33 than when using solder balls. This allows for finer wiring in the semiconductor element 30 and finer wiring in the lower substrate 10. Further, the electronic component-incorporating substrate 1 may incorporate the highly integrated and highly sophisticated semiconductor element 30.

(3) The second connection pads P32 of the semiconductor element 30 are connected by the bonding wires 50 to the connection pads P22 of the upper substrate 20. When using the bonding wires 50, the interval between the bonding wires 50 only needs to be greater than or equal to the width of a head of the bonding tool used to connect the bonding wires 50 to the second connection pads P32 and the connection pads P22. The head is narrower than the interval at which solder balls are laid out. Thus, the second connection pads P32 may be laid out in single lines along the periphery (each side) of the semiconductor element 30 (refer to FIG. 2). In the same manner, the connection pads P22 may be laid out in single lines along the periphery (each side) of the upper substrate 20 (refer to FIG. 2). This allows the distance to be shortened from the semiconductor element 30 to the periphery (outer side surfaces) of the upper substrate 20 and allows the electronic component-incorporating substrate 1 to be reduced in size.

(4) The gap between the semiconductor element 30 and the lower substrate 10 is filled with the underfill resin 60 that covers the circuit formation surface 31b of the element body 31 (lower surface as viewed in FIG. 1), the first connection pads P31, the second connection pads P32, the metal posts 33, and the first ends 51 and loops 53 of the bonding wires 50. Preferably, a resin material having high fluidity is used as the underfill resin 60. The high fluidity allows the gaps between the metal posts 33, the gaps between the bonding wires 50, and the accommodation portion 18 to be filled with the underfill resin 60. Further, the high fluidity limits deformation of the bonding wires 50.

(5) The gap between the lower substrate 10 and the upper substrate 20 is filled with the encapsulation resin 70 that covers the semiconductor element 30, the connection pads P22, and the second ends 52 of the bonding wires 50 connected to the connection pads P22. The first ends 51 and loops 53 of the bonding wires 50 are covered by the underfill resin 60. This limits deformation of the bonding wires 50 when charging the encapsulation mold with the encapsulation resin 70.

It should be apparent to those skilled in the art that the foregoing embodiments may be implemented in many other specific forms without departing from the scope of this disclosure. Particularly, it should be understood that the foregoing embodiments may be implemented in the following forms.

In the modified examples described hereinafter, same reference numerals are given to those components that are the same as the corresponding components of the above embodiment. Such components will not be described in detail.

The structure of the accommodation portion 18 may be modified.

Figure 10A:
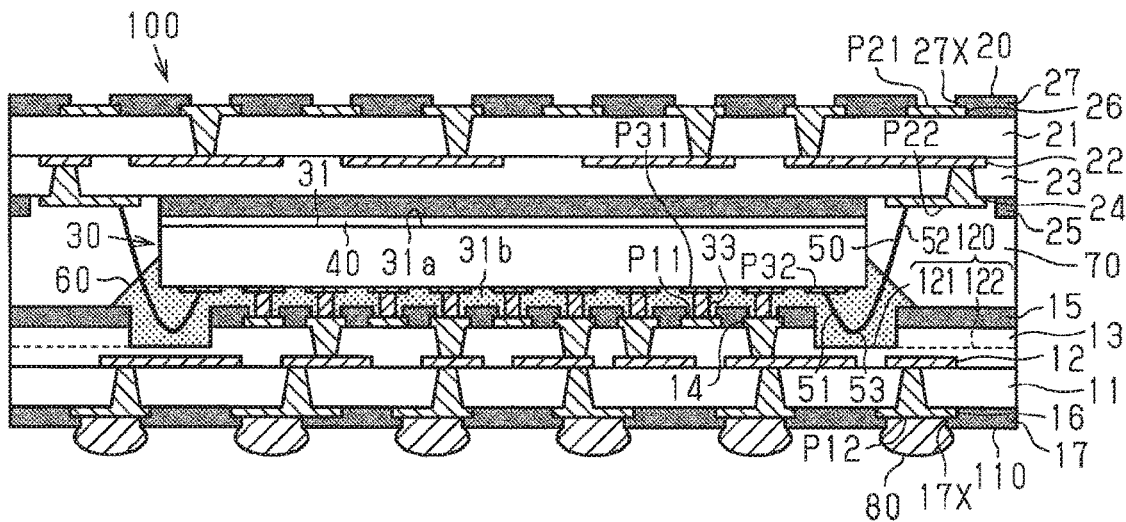
FIG. 10A is a schematic cross-sectional view illustrating a modified example of the electronic component-incorporating substrate.

FIG. 10A illustrates another electronic component-incorporating substrate 100. The electronic component-incorporating substrate 100 includes a lower substrate 110, the upper substrate 20, the semiconductor element 30 (semiconductor chip), the bonding wires 50, the underfill resin 60, and the encapsulation resin 70.

Figure 10B:
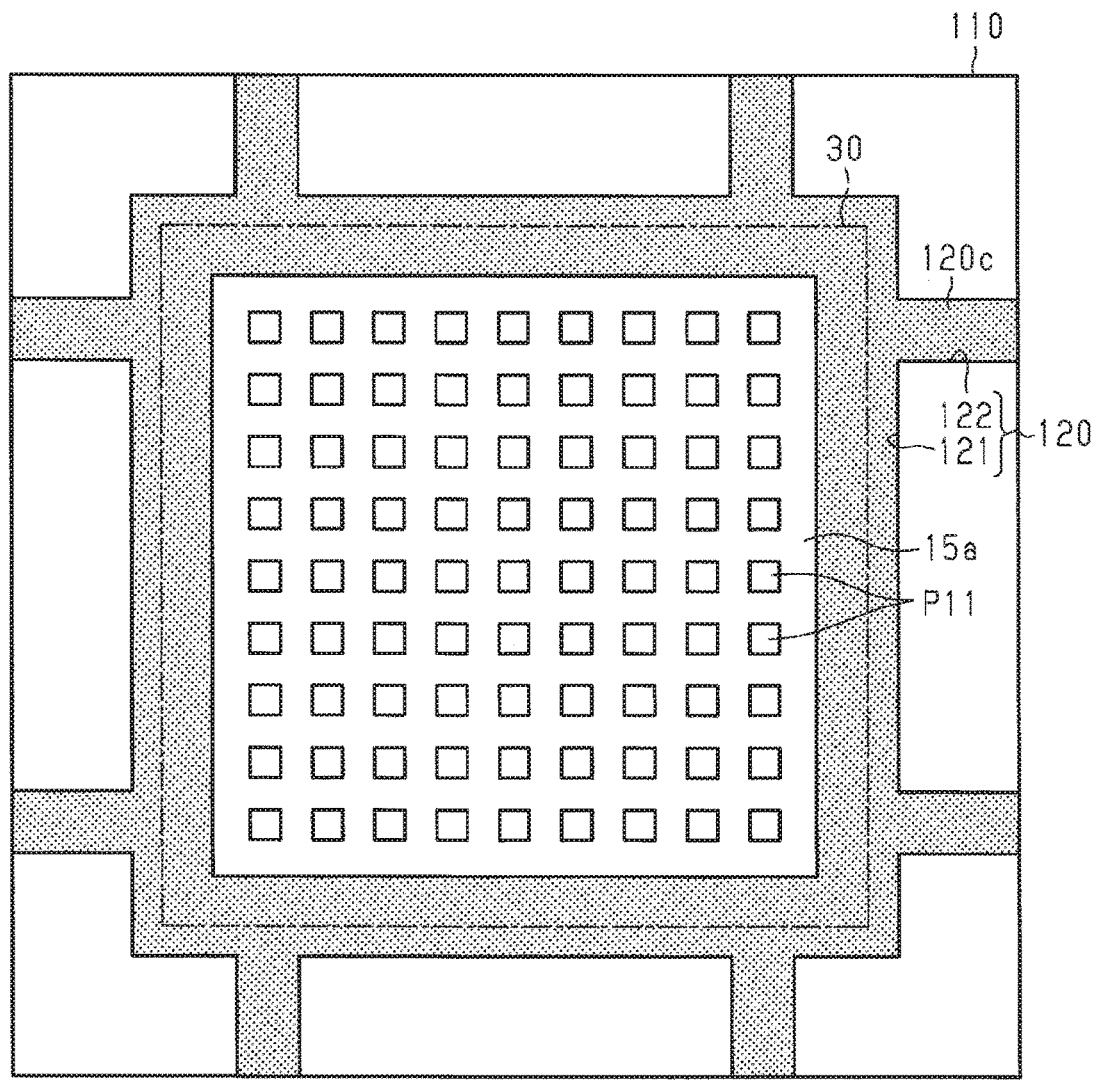
FIG. 10B is a schematic plan view illustrating a lower substrate of the electronic component-incorporating substrate of FIG. 10A.

As illustrated in FIGS. 10A and 10B, the lower substrate 110 includes an accommodation portion 120. The accommodation portion 120 includes a first accommodation portion 121 and second accommodation portions 122. The first accommodation portion 121 is a frame-shaped groove extending along the periphery (i.e., four ends) of the semiconductor element 30. Each of the second accommodation portions 122 is a groove extending from the first accommodation portion 121 to one of the outer side surfaces of the lower substrate 110. Accordingly, the second accommodation portions 122 are open in the outer side surfaces of the lower substrate 110. The first accommodation portion 121 is continuous with the second accommodation portions 122. The accommodation portion 120 includes a bottom surface 120c that is continuous between the first accommodation portion 121 and the second accommodation portions 122. Thus, the accommodation portion 120 extends from the periphery of the semiconductor element 30 to the outer side surfaces of the lower substrate 110 in a plan view. In the accommodation portion 120, when filling the first accommodation portion 121 with the underfill resin 60, the second accommodation portions 122 may move the voids produced in the accommodation portion 120 (underfill resin 60) out of the outer side surfaces of the lower substrate 110 to the region that is cut when undergoing fragmentation to obtain the lower substrate 110. This reduces voids remaining in the accommodation portion 120. When a void is produced, the void may cause delamination of the resin located near the void. This will lower the reliability of the electronic component-incorporating substrate 100. Thus, the reduction of remaining voids improves the reliability of the electronic component-incorporating substrate 100.

Figure 11A:
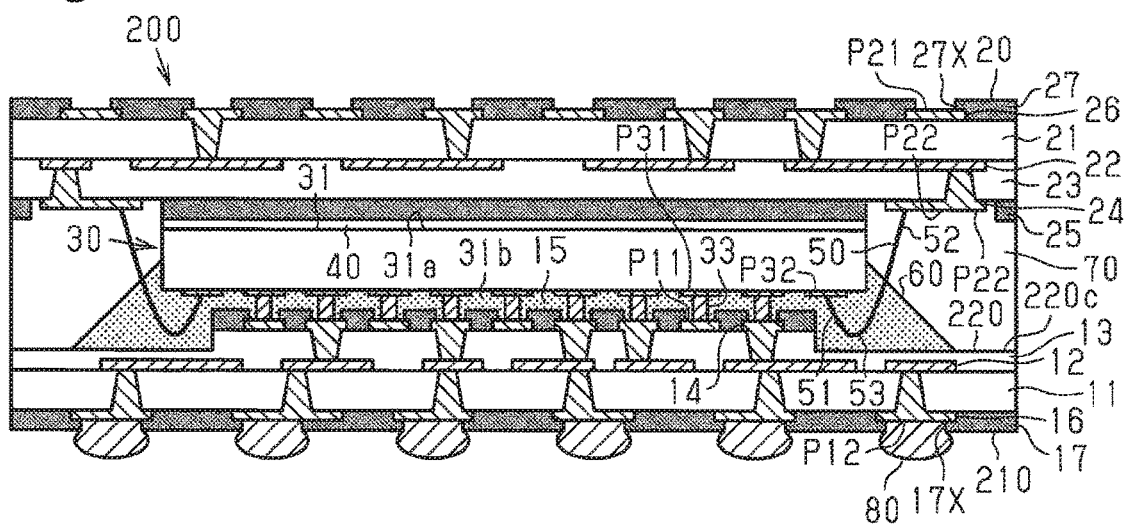
FIG. 11A is a schematic cross-sectional view illustrating another modified example of the electronic component-incorporating substrate.

FIG. 11A illustrates another electronic component-incorporating substrate 200. The electronic component-incorporating substrate 200 includes a lower substrate 210, the upper substrate 20, the semiconductor element 30 (semiconductor chip), the bonding wires 50, the underfill resin 60, and the encapsulation resin 70.

Figure 11B:
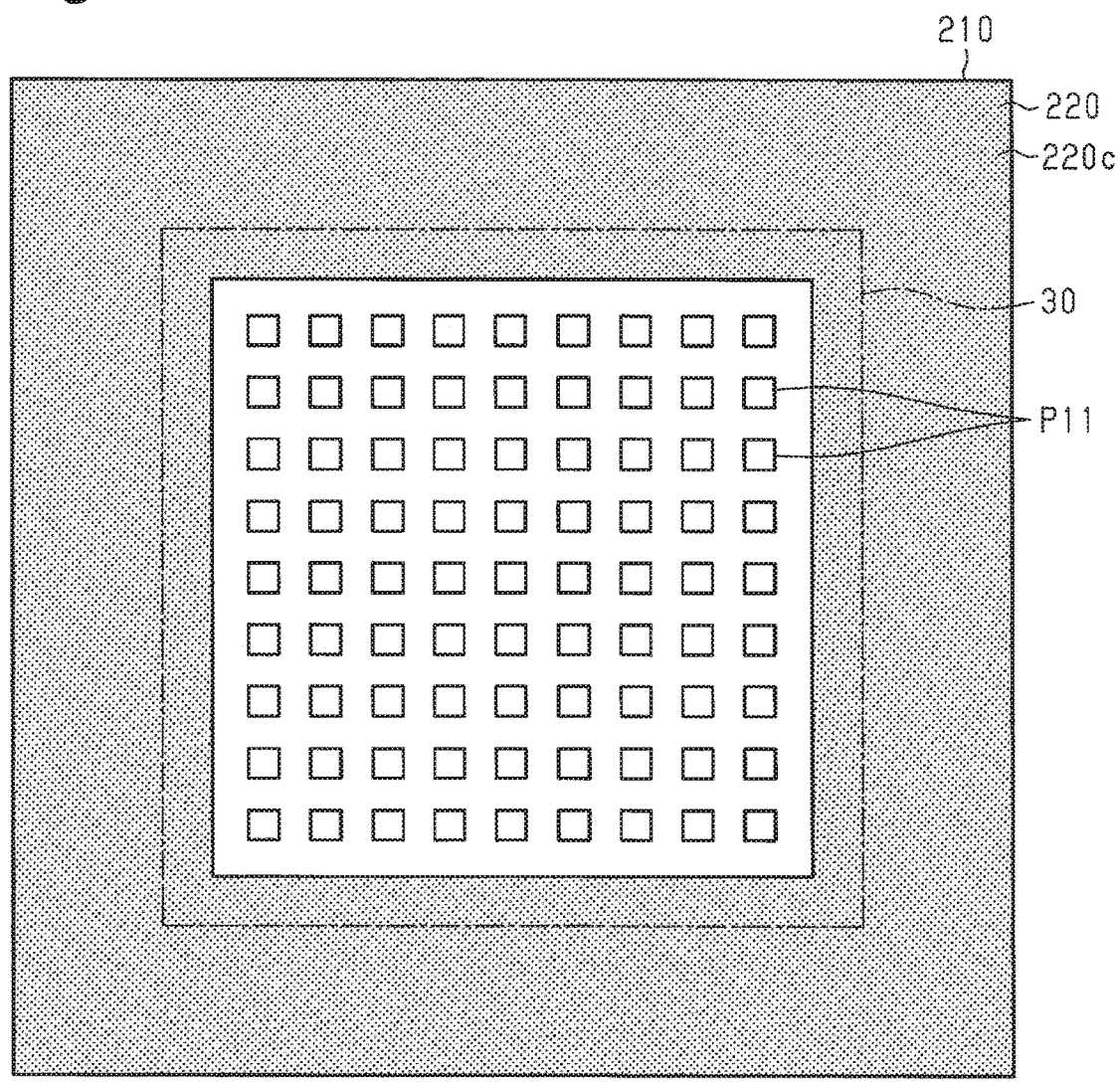
FIG. 11B is a schematic plan view illustrating a lower substrate of the electronic component-incorporating substrate of FIG. 11A.

As illustrated in FIGS. 11A and 11B, the lower substrate 210 includes an accommodation portion 220. The accommodation portion 220 is formed in the periphery (i.e., four sides) of the lower substrate 210 and opens throughout the outer side surfaces of the lower substrate 210. For example, the accommodation portion 220 may be formed by a single frame-shaped recess. In a plan view, the accommodation portion 220 includes a bottom surface 220c extending from a region overlapped with the periphery (second connection pads P32) of the semiconductor element 30 to the outer side surfaces of the lower substrate 210. In the same manner as the accommodation portion 120 illustrated in FIGS. 10A and 10B, the accommodation portion 220 may reduce voids remaining in the accommodation portion 220 when forming the underfill resin 60.

Figure 12:
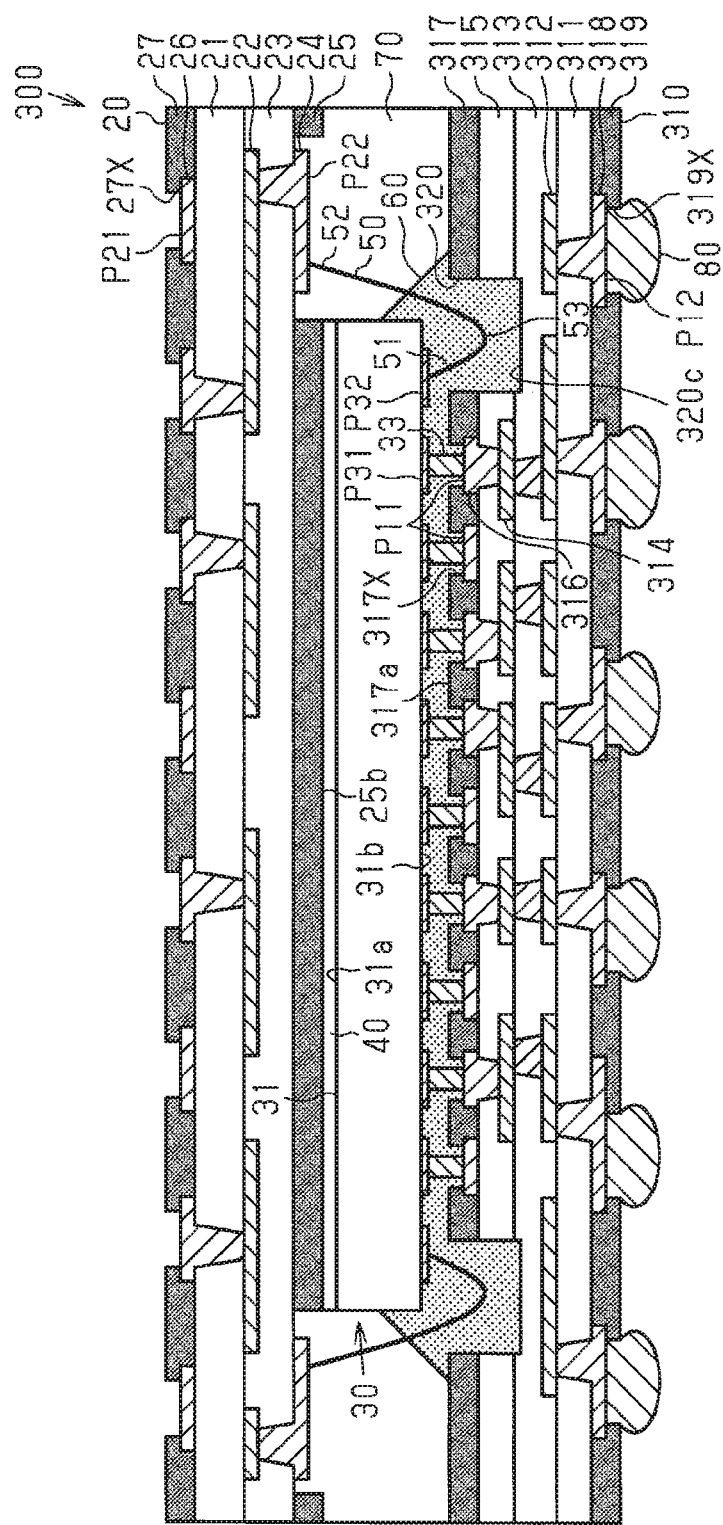
FIGS. 12 to 14 are schematic cross-sectional views illustrating various modified examples of the electronic component-incorporating substrate.

FIG. 12 illustrates another electronic component-incorporating substrate 300. The electronic component-incorporating substrate 300 includes a lower substrate 310, the upper substrate 20, the semiconductor element 30 (semiconductor chip), the bonding wires 50, the underfill resin 60, and the encapsulation resin 70.

The lower substrate 310 includes an insulation layer 311, a wiring layer 312, an insulation layer 313, a wiring layer 314, an insulation layer 315, a wiring layer 316, a solder resist layer 317, a wiring layer 318, and a the solder resist layer 319.

The insulation layer 311 may be, for example, a glass epoxy substrate obtained by impregnating a glass cloth with epoxy resin. The insulation layer 311 may be a substrate formed by impregnating a woven cloth or non-woven cloth of glass fibers, carbon fibers, aramid fibers, or the like with an insulative resin such as an epoxy resin. In the present example, a glass epoxy substrate is used as the insulation layer 311. The glass cloth and the like are not illustrated in FIG. 12.

The wiring layer 312 is formed on the upper surface of the insulation layer 311. The material of the wiring layer 312 may be, for example, copper, a copper alloy, or the like.

The insulation layer 313, which is formed on the upper surface of the insulation layer 311, covers the wiring layer 312. The material of the insulation layer 313 may be, for example, an insulative resin such as a thermosetting epoxy resin. The insulation layer 313 may include a filler of silica (silicon dioxide) or the like.

The wiring layer 314 is formed on the upper surface of the insulation layer 313. The wiring layer 314 includes via wirings, which extend through the insulation layer 313 in the thickness-wise direction, and wiring patterns, which are formed on the upper surface of the insulation layer 313 and connected by the via wirings of the wiring layer 314 to the wiring layer 312. The material of the wiring layer 314 may be, for example, copper, a copper alloy, or the like.

The insulation layer 315 covers the wiring layer 314 formed on the upper surface of the insulation layer 313. The material of the insulation layer 315 may be, for example, an insulative resin such as a thermosetting epoxy resin. The insulation layer 315 may include a filler of silica (silicon dioxide) or the like.

The wiring layer 316 is formed on the upper surface of the insulation layer 315. The wiring layer 316 includes via wirings, which extend through the insulation layer 315 in the thickness-wise direction, and wiring patterns, which are formed on the upper surface of the insulation layer 315 and connected by the via wirings of the wiring layer 316 to the wiring layer 314. The material of the wiring layer 316 may be, for example, copper, a copper alloy, or the like.

The solder resist layer 317, which is formed on the upper surface of the insulation layer 315, covers parts of the wiring layer 316 and the upper surface of the insulation layer 315. The solder resist layer 317 includes openings 317X that expose parts of the upper surface of the wiring layer 316 as the mounting pads P11. The material of the solder resist layer 317 may be, for example, an insulative resin such as an epoxy resin or an acrylic resin. When necessary, a surface-processed layer may be formed on the upper surface of the wiring layer 316 exposed in the openings 317X of the solder resist layer 317.

The wiring layer 318 is formed on the lower surface of the insulation layer 311. The wiring layer 318 includes via wirings, which extend through the insulation layer 311 in the thickness-wise direction, and wiring patterns, which are formed on the lower surface of the insulation layer 311 and connected by the via wirings of the wiring layer 318 to the wiring layer 312. The material of the wiring layer 318 may be, for example, copper, a copper alloy, or the like.

The solder resist layer 319, which is formed on the lower surface of the insulation layer 311, covers parts of the wiring layer 318 and the lower surface of the insulation layer 311. The solder resist layer 319 includes openings 319X that expose parts of the lower surface of the wiring layer 318 as the external connection pads P12. The material of the solder resist layer 319 may be, for example, an insulative resin such as an epoxy resin or an acrylic resin. When necessary, a surface-processed layer may be formed on the lower surface of the wiring layer 318 exposed in the openings 319X of the solder resist layer 319.

The lower substrate 310 includes an accommodation portion 320. The accommodation portion 320 accommodates the loops 53 of the bonding wires 50, which connect the second connection pads P32 of the semiconductor element 30 and the connection pads P22 of the upper substrate 20. The accommodation portion 320 includes a bottom surface 320c. The bottom surface 320c is located at a lower position than an upper surface 317a of the solder resist layer 317 that is the upper surface of the lower substrate 310. In this modified example, the bottom surface 320c of the accommodation portion 320 is located inside the insulation layer 313 of the lower substrate 310. In the example illustrated in FIG. 12, an opening (through hole) extending through the solder resist layer 317 in the thickness-wise direction, an opening (through hole) extending through the insulation layer 315 in the thickness-wise direction, and a recess formed in the insulation layer 313 form the accommodation portion 320. In the same manner as FIG. 3, the accommodation portion 320 is a frame-shaped groove extending along the periphery of the semiconductor element 30.

The electronic component-incorporating substrate 300 has the same advantages as the above embodiment.

In FIG. 12, the lower substrate 310 includes the insulation layers 311, 313, and 315 and the solder resist layers 317 and 319. However, four or more insulation layers may be included between the solder resist layers 317 and 319. In this case, the accommodation portion 320 may be recessed downward to extend from the upper surface of the uppermost insulation layer (upper surface 317a of solder resist layer 317) over three or more layers.

Figure 13:
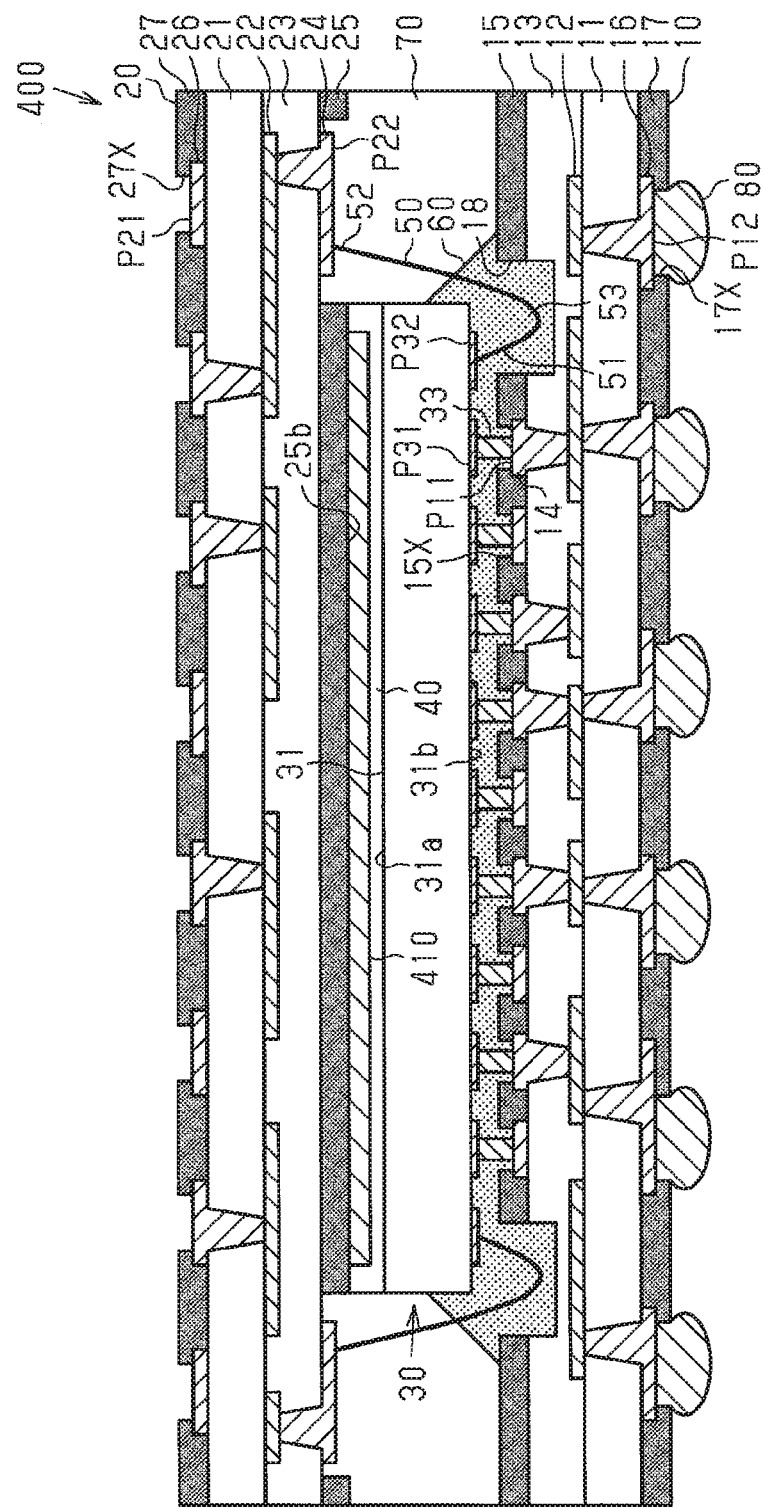

FIG. 13 illustrates another electronic component-incorporating substrate 400. The electronic component-incorporating substrate 400 includes the lower substrate 10, the upper substrate 20, the semiconductor element 30 (semiconductor chip), the bonding wires 50, the underfill resin 60, the encapsulation resin 70, and an adjustment plate 410.

The adjustment plate 410 is located between the semiconductor element 30 and the upper substrate 20. In FIG. 13, the adjustment plate 410 is attached to the lower surface 25b of the solder resist layer 25 of the upper substrate 20. The coefficient of thermal expansion (CTE) of the adjustment plate 410 adjusts warping of the electronic component-incorporating substrate 400. A low-CTE material such as a Si substrate (dummy chip or glass) may be used as the adjustment plate 410. A CTE material having a slightly higher CTE than the upper substrate 20 and the lower substrate 10 may be used as the adjustment plate 410 for CTE-matching.

Figure 14:
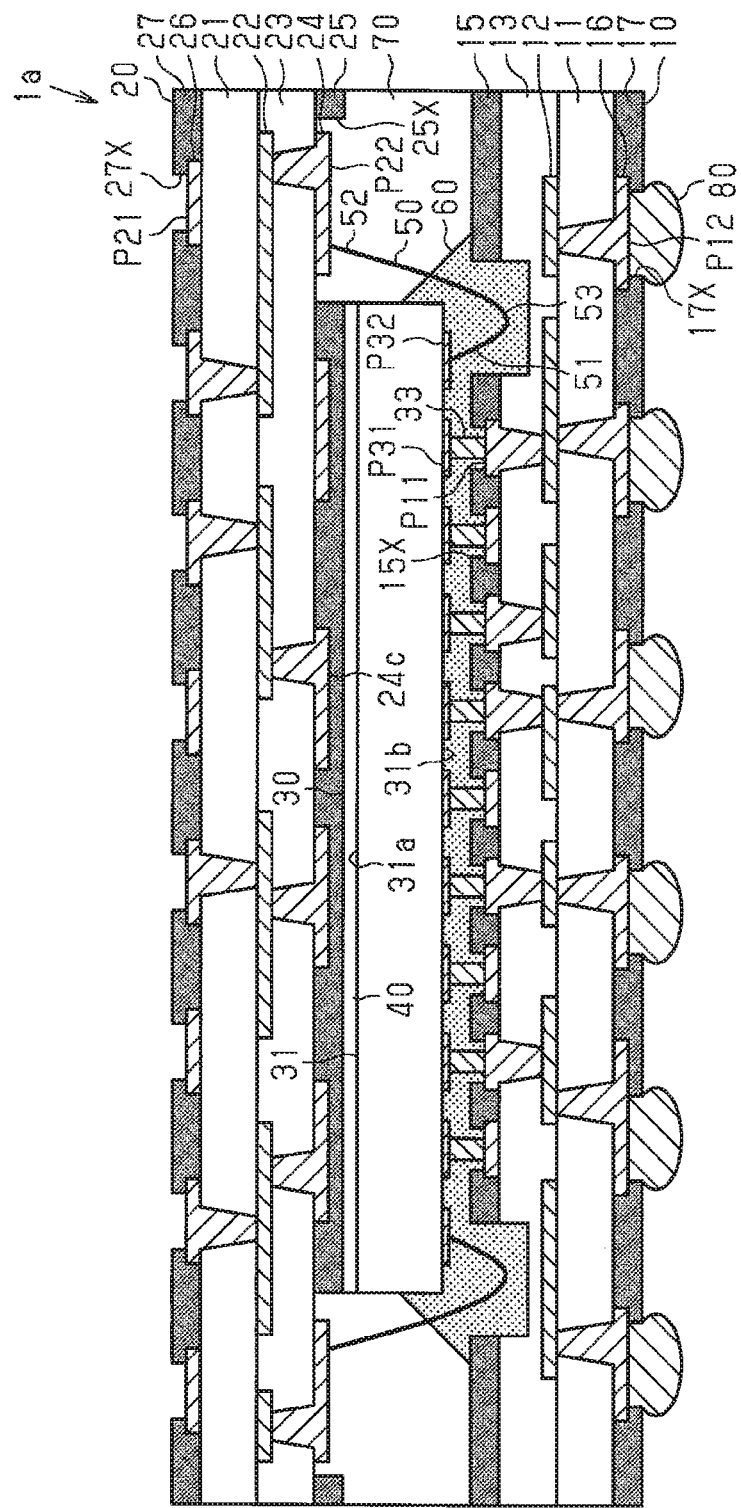

FIG. 14 illustrates another electronic component-incorporating substrate 1a. The electronic component-incorporating substrate 1a includes the lower substrate 10, the upper substrate 20, the semiconductor element 30 (semiconductor chip), the bonding wires 50, the underfill resin 60, and the encapsulation resin 70. In addition to the connection pads P22, the wiring layer 24 of the upper substrate 20 includes wiring patterns 24c and via wirings that extend through the insulation layer 23 and connect the wiring patterns 24c to the wiring layer 22. The wiring patterns 24c are covered by the solder resist layer 25, which is adhered to the semiconductor element 30. Although not illustrated in FIG. 14, a capacitor or a coil may be arranged between the upper substrate 20 and the semiconductor element 30 by forming openings exposing parts of the wiring patterns 24c of the wiring layer 24 in the solder resist layer 25.

The solder resist connected to the semiconductor element 30 may be omitted from the upper substrate 20 to further reduce the thickness of the electronic component-incorporating substrate.

The upper substrate 20 may include one insulation layer or three insulation layers between the solder resist layers 25 and 27.

For example, in FIG. 1, at least one of the upper substrate 20 and the lower substrate 10 may be a cored build-up substrate, which includes a core substrate, a silicon substrate, or a ceramic substrate. The same applies to the other embodiments.

The embodiments and the modified examples described above may be combined as long as there is no technical contradiction.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An electronic component-incorporating substrate comprising:
   a lower substrate including a mounting pad in an upper surface of the lower substrate;
   an upper substrate including a connection pad in a lower surface of the upper substrate;
   an electronic component located between the lower substrate and the upper substrate and including a first connection pad and a second connection pad on a lower surface of the electronic component;
   a metal post connecting the first connection pad to the mounting pad of the lower substrate;
   a bonding wire including a first end connected to the second connection pad and a second end connected to the connection pad of the upper substrate; and
   an underfill resin filling a space between the electronic component and the lower substrate and covering the metal post and the first end of the bonding wire, wherein
   the bonding wire further includes a loop located at a lower position than a lower end of the metal post, and
   the lower substrate further includes an accommodation portion that accommodates the loop of the bonding wire.

2. The electronic component-incorporating substrate according to claim 1, wherein the loop includes a loop peak located at a lower position than the lower end of the metal post.

3. The electronic component-incorporating substrate according to claim 1, wherein the underfill resin further covers the loop accommodated in the accommodation portion.

4. The electronic component-incorporating substrate according to claim 1, wherein the accommodation portion includes a first groove extending along a periphery of the electronic component, and the first groove is filled with the underfill resin.

5. The electronic component-incorporating substrate according to claim 4, wherein the first groove is a frame-shaped groove extending along the periphery of the electronic component.

6. The electronic component-incorporating substrate according to claim 1, wherein the accommodation portion includes a first groove that extends along a periphery of the electronic component and a second groove that extends from the first groove to an outer side surface of the lower substrate.

7. The electronic component-incorporating substrate according to claim 1, wherein the accommodation portion is formed in a periphery of the lower substrate and opens throughout an outer side surface of the lower substrate.

8. The electronic component-incorporating substrate according to claim 1, wherein the accommodation portion is located in a region overlapped with the second connection pad of the electronic component in a plan view.

9. The electronic component-incorporating substrate according to claim 1, further comprising an encapsulation resin that fills a space between the lower substrate and the upper substrate to encapsulate the electronic component.

10. The electronic component-incorporating substrate according to claim 9, wherein each of the encapsulation resin and the underfill resin is an insulative resin including a filler, and the filler included in the underfill resin is smaller in size than the filler included in the encapsulation resin.

11. The electronic component-incorporating substrate according to claim 1, wherein the lower substrate includes a plurality of insulation layers, and the accommodation portion is recessed downward from an upper surface of an uppermost one of the plurality of insulation layers over at least two of the plurality of insulation layers.

12. The electronic component-incorporating substrate according to claim 1, further comprising an adjustment plate attached to the lower surface of the upper substrate and located between the electronic component and the upper substrate to adjust warping of the electronic component-incorporating substrate.

* * * * *